United States Patent
Chen

(10) Patent No.: US 11,650,666 B2
(45) Date of Patent: May 16, 2023

(54) VIBRATOR, MANUFACTURING METHOD THEREOF, HAPTICAL SENSATION REPRODUCTION APPARATUS AND VIBRATION WAVEFORM DETECTION METHOD

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/515,192

(22) Filed: Oct. 29, 2021

(65) Prior Publication Data
US 2022/0269347 A1 Aug. 25, 2022

(30) Foreign Application Priority Data
Feb. 25, 2021 (CN) .......................... 202110212852.7

(51) Int. Cl.
*G06F 3/01* (2006.01)

(52) U.S. Cl.
CPC .............. *G06F 3/016* (2013.01); *H10N 30/05* (2023.02); *H10N 30/20* (2023.02); *H10N 30/88* (2023.02)

(58) Field of Classification Search
CPC ....... G06F 3/016; H01L 41/053; H01L 41/09; H01L 41/27; H01L 41/314; H01L 41/083; H01L 41/297; H01L 41/22
See application file for complete search history.

(56) References Cited

U.S. PATENT DOCUMENTS

2007/0018539 A1\* 1/2007 Nagashima ............. H01L 24/97
310/348

FOREIGN PATENT DOCUMENTS

| CN | 200944563 Y | * | 9/2007 |
| CN | 107203273 A | * | 9/2017 |
| CN | 108899353 A | * | 11/2018 |

\* cited by examiner

*Primary Examiner* — Nelson M Rosario
*Assistant Examiner* — Scott D Au
(74) *Attorney, Agent, or Firm* — IPro, PLLC

(57) ABSTRACT

A vibrator, a manufacturing method thereof, a haptical sensation reproduction apparatus and a vibration waveform detection method, and relates to the technical field of display. The vibrator comprises a substrate, and a piezoelectric component and a light-emitting component located on the substrate, wherein the piezoelectric component comprises an inverse piezoelectric unit, the light-emitting component comprises a direct piezoelectric unit and a light-emitting unit, and the inverse piezoelectric unit is in contact and connected with the direct piezoelectric unit. The vibrator of this solution may be disposed in a touch-control reproduction screen, the inverse piezoelectric unit in the vibrator is driven to deform to generate vibrations, and the direct piezoelectric unit in contact and connection therewith is driven to deform to generate a current to drive the light-emitting unit to emit light.

15 Claims, 7 Drawing Sheets

| Acquiring an apparatus image on a light-exiting side of the haptical sensation reproduction apparatus | S401 |

| Acquiring a vibration waveform according to a light-emitting image of a vibrator of the haptical sensation reproduction apparatus in the apparatus image | S402 |

VIBRATOR, MANUFACTURING METHOD THEREOF, HAPTICAL SENSATION REPRODUCTION APPARATUS AND VIBRATION WAVEFORM DETECTION METHOD

CROSS REFERENCE TO RELEVANT APPLICATIONS

The present application claims the priority of the Chinese patent application filed on Feb. 25, 2021 before the Chinese Patent Office with the application number of 202110212852.7 and the title of "VIBRATOR, MANUFACTURING METHOD THEREOF, HAPTICAL SENSATION REPRODUCTION APPARATUS AND VIBRATION WAVEFORM DETECTION METHOD", which is incorporated herein in its entirety by reference.

TECHNICAL FIELD

The disclosure relates to the technical field of display, in particular to a vibrator, a manufacturing method thereof, a haptical sensation reproduction apparatus and a vibration waveform detection method.

BACKGROUND

Haptical feedback is a technology that enables terminal equipment to interact with human bodies through haptical sensations. The haptical reproduction technology allows the characteristics of an object to be sensed through touching of a screen, and enables different haptical sensations to be simulated through vibrators disposed on a touch screen according to different frictional forces between a surface of the object and skin, thus realizing efficient and natural interaction with multimedia terminals, and the research value is great. Therefore, a vibration waveform on the touch screen with haptical sensation reproduction needs to be detected.

In the prior art, the vibration waveform is generally analyzed and obtained according to the dispersion and aggregation conditions of particles placed on the touch screen when the touch screen vibrates, or laser vibration measurement equipment is used to measure laser vibration measurement information that is then fitted and analyzed by software to obtain the vibration waveform.

SUMMARY

The embodiments of the disclosure provide a vibrator, a manufacturing method thereof, a haptical sensation reproduction apparatus and a vibration waveform detection method.

The embodiments of the disclosure adopt the following technical solution:

in one aspect, a vibrator is provided, comprising a substrate, and a piezoelectric component and a light-emitting component located on the substrate, wherein the piezoelectric component comprises an inverse piezoelectric unit, the light-emitting component comprises a direct piezoelectric unit and a light-emitting unit, the inverse piezoelectric unit is in contact and connected with the direct piezoelectric unit, and the direct piezoelectric unit is electrically connected with the light-emitting unit;

the piezoelectric component is configured to receive an electrical signal to make the inverse piezoelectric unit deform, to drive the direct piezoelectric unit to deform; and the direct piezoelectric unit is configured to generate a current when deformation occurs, to drive the light-emitting unit to emit light.

Optionally, the piezoelectric component further comprises a top electrode and a bottom electrode;

the bottom electrode, the inverse piezoelectric unit and the top electrode are disposed in layer configuration on the substrate;

the inverse piezoelectric unit is disposed between the bottom electrode and the substrate;

a surface, away from the bottom electrode, of the inverse piezoelectric unit is provided with the top electrode and the direct piezoelectric unit on a same layer; and a surface, away from the inverse piezoelectric unit, of the direct piezoelectric unit is electrically connected with the light-emitting unit.

Optionally, an external circuit is disposed on the top electrode, and the top electrode is configured to receive an electrical signal sent by the external circuit, to make the inverse piezoelectric unit deform.

Optionally, the light-emitting unit comprises an LED electrode and an LED chip, the LED electrode is electrically connected with the direct piezoelectric unit, and the LED electrode is disposed between the direct piezoelectric electrode and the LED chip.

Optionally, the inverse piezoelectric unit is a piezoelectric ceramic electrode, and the direct piezoelectric unit is an interdigital electrode.

Optionally, the substrate is a transparent substrate.

In another aspect, a manufacturing method of the aforementioned vibrator is provided, comprising:

providing a substrate;

forming a bottom electrode on the substrate;

forming an inverse piezoelectric unit on a surface, away from the substrate, of the bottom electrode;

forming a top electrode and a direct piezoelectric unit on a same surface, away from the bottom electrode, of the inverse piezoelectric unit;

polarizing the bottom electrode and the top electrode; and providing a light-emitting unit, wherein the light-emitting unit is welded on a surface, away from the inverse piezoelectric unit, of the direct piezoelectric unit.

Alternatively, polarizing the bottom electrode and the top electrode comprises:

applying a voltage to the top electrode, to polarize the top electrode and the bottom electrode.

In yet another aspect, a haptical sensation reproduction apparatus is provided, comprising a touch display device and a controller, wherein the touch display device comprises a display component, a touch component and the vibrator according to any one of claims 1-6, the vibrator and the touch component are located on a light-exiting side of the display component, and the vibrator is disposed on a surface, away from the display component, of the touch component; and the controller is electrically connected with the vibrator and the touch component, and is configured to acquire a touch signal generated by the touch component, and send an electrical signal to the vibrator according to the touch information, so that the inverse piezoelectric unit in the vibrator resonates with the touch component, and the direct piezoelectric unit in the vibrator deforms to generate a current to drive the light-emitting unit in the vibrator to emit light.

Optionally, a plurality of the vibrators are disposed in a vertical array on the touch component.

In still another aspect, a vibration waveform detection method of the aforementioned haptical sensation reproduction apparatus is provided, comprising:

acquiring an apparatus image on a light-exiting side of the haptical sensation reproduction apparatus; and acquiring a vibration waveform according to a light-emitting image of a vibrator of the haptical sensation reproduction apparatus in the apparatus image.

BRIEF DESCRIPTION OF THE DRAWINGS

In order to more clearly explain the embodiments of the disclosure or the technical solution in the prior art, the following will briefly introduce the drawings needed in the description of the embodiments or the prior art. Obviously, the drawings in the following description only illustrate some embodiments of the disclosure. For those of ordinary skill in the art, other drawings can be obtained according to the following ones without creative labor.

DETAILED DESCRIPTION

Hereinafter, the technical solution in the embodiments of the disclosure will be described clearly and fully with reference to the drawings in the embodiments of the disclosure. Obviously, the described embodiments are only illustrative ones, and are not all possible ones of the disclosure. Based on the embodiments of the disclosure, all other embodiments obtained by those of ordinary skill in the art without creative labor are within the scope of the disclosure.

In the embodiments of the disclosure, the words such as "first" and "second" are used to distinguish the same items or similar items with basically the same function and effect, and they are only to clearly describe the technical solution of the embodiments of the disclosure, but not to be understood as indicating or implying relative importance or implicitly indicating the number of indicated technical features.

In the embodiments of the disclosure, "a plurality of" means two or more, and "at least one" means one or more, unless otherwise specifically defined.

Figure 1:
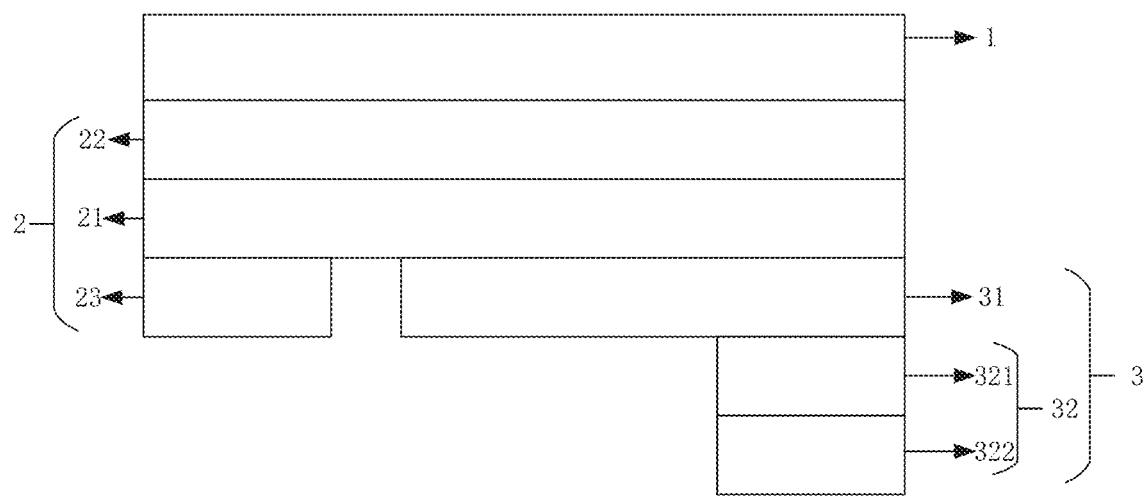
FIG. 1 is a structural diagram of a vibrator provided by an embodiment of the disclosure.

FIG. 1 is a structural diagram of a vibrator provided by an embodiment of the disclosure. The vibrator comprises a substrate 1, and a piezoelectric component 2 and a light-emitting component 3 located on the substrate, wherein the piezoelectric component 2 comprises an inverse piezoelectric unit 21, the light-emitting component 3 comprises a direct piezoelectric unit 31 and a light-emitting unit 32, the inverse piezoelectric unit 21 is in contact and connected with the direct piezoelectric unit 31, and the direct piezoelectric unit 31 is electrically connected with the light-emitting unit 32:

the piezoelectric component 2 is configured to receive an electrical signal to make the inverse piezoelectric unit 21 deform, to drive the direct piezoelectric unit 31 to deform; and the direct piezoelectric unit 31 is configured to generate a current when deformation occurs, to drive the light-emitting unit 32 to emit light.

In the embodiment of this application, the inverse piezoelectric unit 21 is a piezoelectric medium capable of generating an inverse piezoelectric effect, and may be formed by growing or depositing transparent and conductive materials such as Piezoelectric Ceramics Transducer (PZT), aluminum nitride, zinc oxide and polyvinylidene fluoride. The direct piezoelectric unit 31 is a piezoelectric electrode capable of generating a direct piezoelectric effect, and may be formed by producing or depositing piezoelectric materials with the direct piezoelectric effect. The light-emitting unit 32 may be an Light Emitting Diode (LED) unit, an Organic Light-Emitting Diode (OLED) unit, or the like that emits light by current drive. The inverse piezoelectric unit 21 needs to be in contact and connected with the direct piezoelectric unit 31, so that vibrations generated by the deformation of the inverse piezoelectric unit 21 may be transmitted to the direct piezoelectric unit 31.

In practical application, the inverse piezoelectric unit 21 receives an electrical signal sent by external equipment through the piezoelectric component to generate the inverse piezoelectric effect, to deform and vibrate, and the mechanical energy of the vibration is transferred to the direct piezoelectric unit 31 in the light-emitting component 3 in contact and connection therewith, causing the direct piezoelectric unit 31 in the light-emitting component 3 to deform, so that the direct piezoelectric unit 31 generates the direct piezoelectric effect to convert the mechanical energy of deformation into a current, and transmits the generated current to the light-emitting unit 32 electrically connected therewith, to drive the light-emitting unit 32 to emit light through the current.

Figure 2:
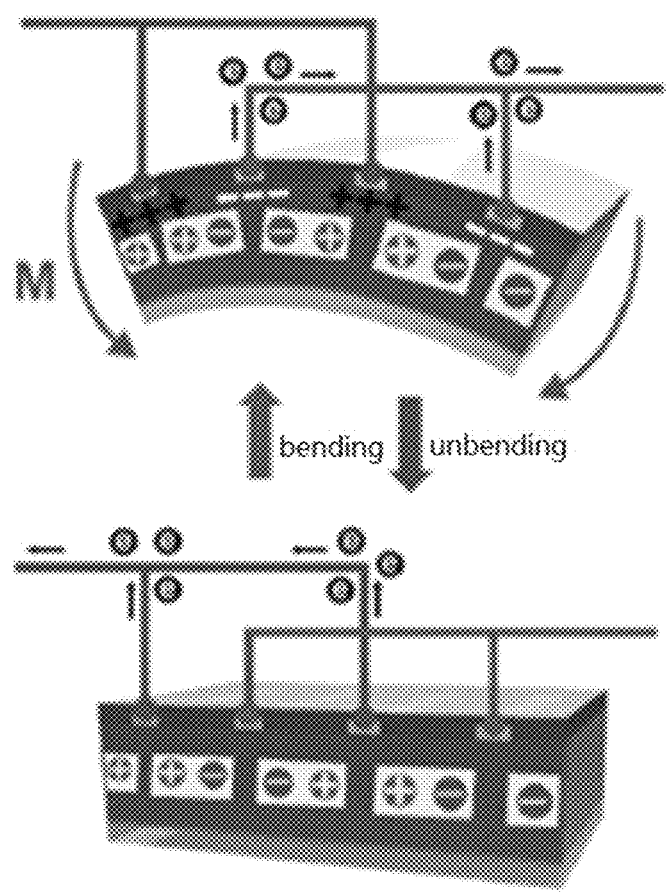
FIG. 2 is a first schematic diagram showing the principle of a direct piezoelectric effect provided by an embodiment of the disclosure.

For convenience of understanding, FIG. 2 provides a first schematic diagram showing the principle of the direct piezoelectric effect. When the direct piezoelectric unit is in an unbending state, no positive and negative current exists in the direct piezoelectric unit, but when the direct piezoelectric unit is in a bending state, a positive and negative current may be generated in the direct piezoelectric unit.

Figure 3:
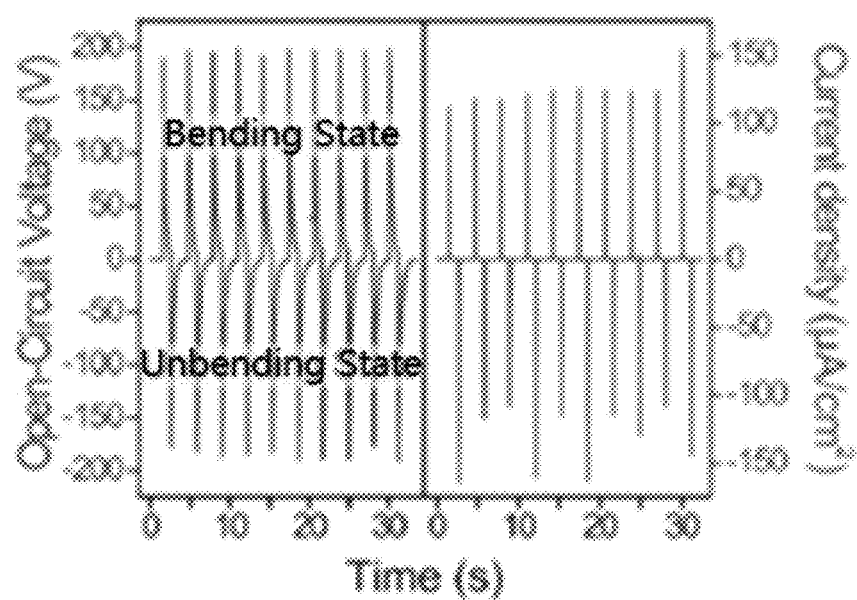
FIG. 3 is a second schematic diagram showing the principle of a direct piezoelectric effect provided by an embodiment of the disclosure.

FIG. 3 provides a second schematic diagram showing the principle of the direct piezoelectric effect. The direct piezoelectric unit deforms due to vibrations, the direct piezoelectric effect causes the direct piezoelectric unit to generate a current with a density corresponding to deformation vibration frequency, so that currents with different densities are transmitted to the light-emitting unit based on different vibration frequencies, and the light-emitting unit will also generate light with different brightnesses.

According to the vibrator provided by the embodiment of this disclosure, the inverse piezoelectric unit in the vibrator is driven by the electric signal to deform to generate vibrations, and the direct piezoelectric unit in contact and connection therewith is driven to deform to generate a current to drive the light-emitting unit to emit light. Therefore, the vibrator may be disposed in a touch-control reproduction screen. Because the amplitude varies, the deformation varies. Therefore, the vibration position and amplitude may be embodied by light spots emitted by the vibrator, so that a vibration waveform may be represented by the light-emitting situation of the light-emitting unit in the vibrator, and then the vibration waveform in the touch-control reproduction screen may be detected efficiently and conveniently.

Optionally, referring to FIG. 1, the piezoelectric component 2 further comprises a top electrode 23 and a bottom electrode 22, the bottom electrode 22, the inverse piezoelectric unit 21 and the top electrode 23 are disposed in layer configuration on the substrate 1, the inverse piezoelectric unit 21 is disposed between the bottom electrode 22 and the substrate 1, a surface, away from the bottom electrode 22, of the inverse piezoelectric unit 21 is provided with the top electrode 23 and the direct piezoelectric unit 31 on a same layer, and a surface, away from the inverse piezoelectric unit 21, of the direct piezoelectric unit 31 is electrically connected with the light-emitting unit 32.

In the embodiment of this disclosure, by disposing the bottom electrode between the inverse piezoelectric unit 21 and the substrate 1, a bottom of the inverse piezoelectric unit 21 may be prevented from making direct contact with the substrate 1, so that damage to the inverse piezoelectric unit 21 is avoided. In addition, the top electrode 23 is disposed on a same side of the inverse piezoelectric unit 21 as the light-emitting unit 32, which may prevent a top of the inverse piezoelectric unit 21 from being directly exposed and damaged, thus improving the stability of the vibrator.

The direct piezoelectric unit 31 and the inverse piezoelectric unit 21 may be superimposed on a light-exiting side or a backlight side of the light-emitting unit 32. When disposed on the light-exiting side, the direct piezoelectric unit 31 and the inverse piezoelectric unit 21 need to be made of transparent materials in order to ensure that light emitted by the light-emitting unit 32 can be detected. In this way, the light emitted by the light-emitting unit 32 may pass through the direct piezoelectric unit 31 and the inverse piezoelectric unit 21 and be visually perceived by users or collected by detection equipment.

According to the embodiment of this disclosure, by adopting the direct piezoelectric unit and the inverse piezoelectric unit made of transparent materials, it is ensured that when the direct piezoelectric unit and the inverse piezoelectric unit are disposed on the light-exiting side of the light-emitting unit, the light emitted by the light-emitting unit may be radiated to the surrounding environment.

Figure 4:
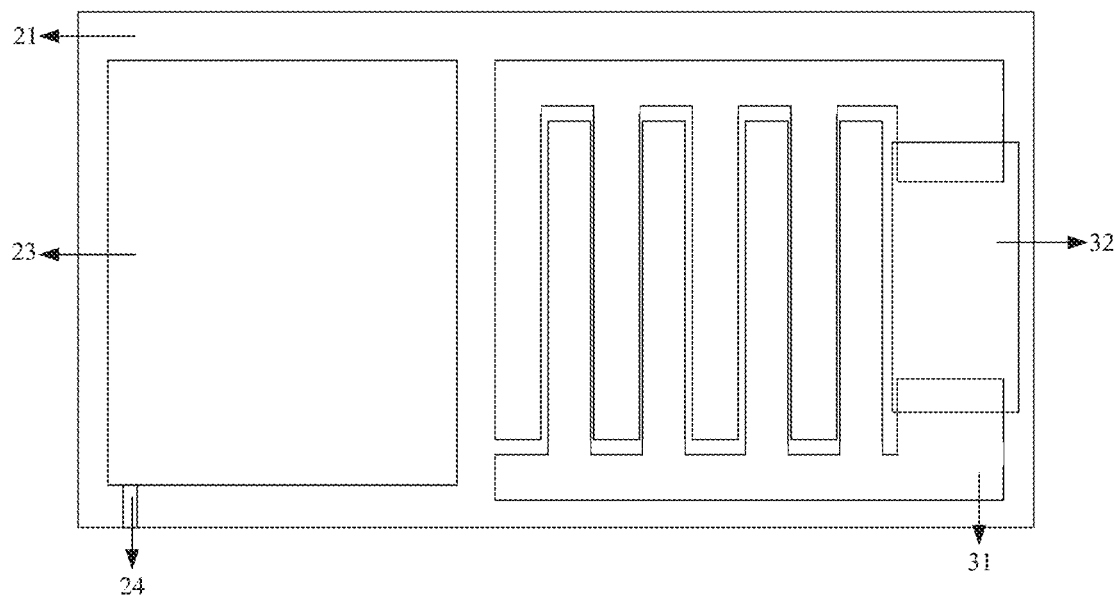
FIG. 4 is a structural diagram of another vibrator provided by an embodiment of the disclosure.

Optionally, referring to FIG. 4, the embodiment of this disclosure provides a structural diagram of another vibrator, in which the inverse piezoelectric unit 21 is a piezoelectric ceramic electrode and the direct piezoelectric unit 31 is an interdigital electrode.

In the embodiment of this disclosure, a Piezoelectric Ceramics Transducer (PZT) is an information functional ceramic material which may realize the conversion between mechanical energy and electrical energy. Besides piezoelectricity, the PZT also has dielectricity and elasticity. When serving as an inverse piezoelectric unit, the PZT may efficiently convert electrical energy into mechanical energy, thus generating vibrations. The interdigital electrode (IDE) is an electrode with a periodic pattern in its finger-like or comb-like surface, and is used to produce and penetrate material samples, thus ensuring the transparency of the direct piezoelectric unit.

Optionally, referring to FIG. 4, an external circuit 24 is disposed on the top electrode 23, and the top electrode 23 is configured to receive an electrical signal sent by the external circuit 24, to make the inverse piezoelectric unit 21 deform.

In the embodiment of this disclosure, the top electrode 23 may also be provided with the external circuit 24 to obtain an electrical signal from the outside and transmit the signal to the inverse piezoelectric unit 21, so that the inverse piezoelectric unit 21 deforms and vibrates.

Optionally, the substrate 1 is a transparent substrate.

In the embodiment of this disclosure, the substrate 1 may be a transparent substrate, which may be made of materials such as glass or transparent resin. By disposing the substrate 1 on a side, opposite to the direct piezoelectric unit 31, of the inverse piezoelectric unit 21, the inverse piezoelectric unit 21 may be prevented from being directly exposed, thus ensuring the stability of the vibrator.

Optionally, referring to FIG. 1, the light-emitting unit 32 comprises an LED electrode 321 and an LED chip 322, wherein the LED electrode 321 is electrically connected with the direct piezoelectric unit 31, and the LED electrode 321 is disposed between the direct piezoelectric electrode 31 and the LED chip 322.

In the embodiment of this disclosure, the LED chip 322 is a solid-state semiconductor apparatus. The light-emitting unit 32 may be an LED unit with a horizontal structure, that is, an anode and a cathode of the LED electrode 321 are disposed on a same side of the LED chip 322, thereby enabling a side, opposite to the LED chip 322, of the LED electrode 321 to be connected with the direct piezoelectric unit 31. Specifically, the LED electrode 321 may be welded on the direct piezoelectric unit 31 by growing media such as solder or indium.

According to the embodiment of this disclosure, the LED unit with a horizontal structure is adopted as the light-emitting unit, so that different surfaces of the LED electrode of the light-emitting unit may be connected with the direct piezoelectric unit and the LED chip.

Figure 5:
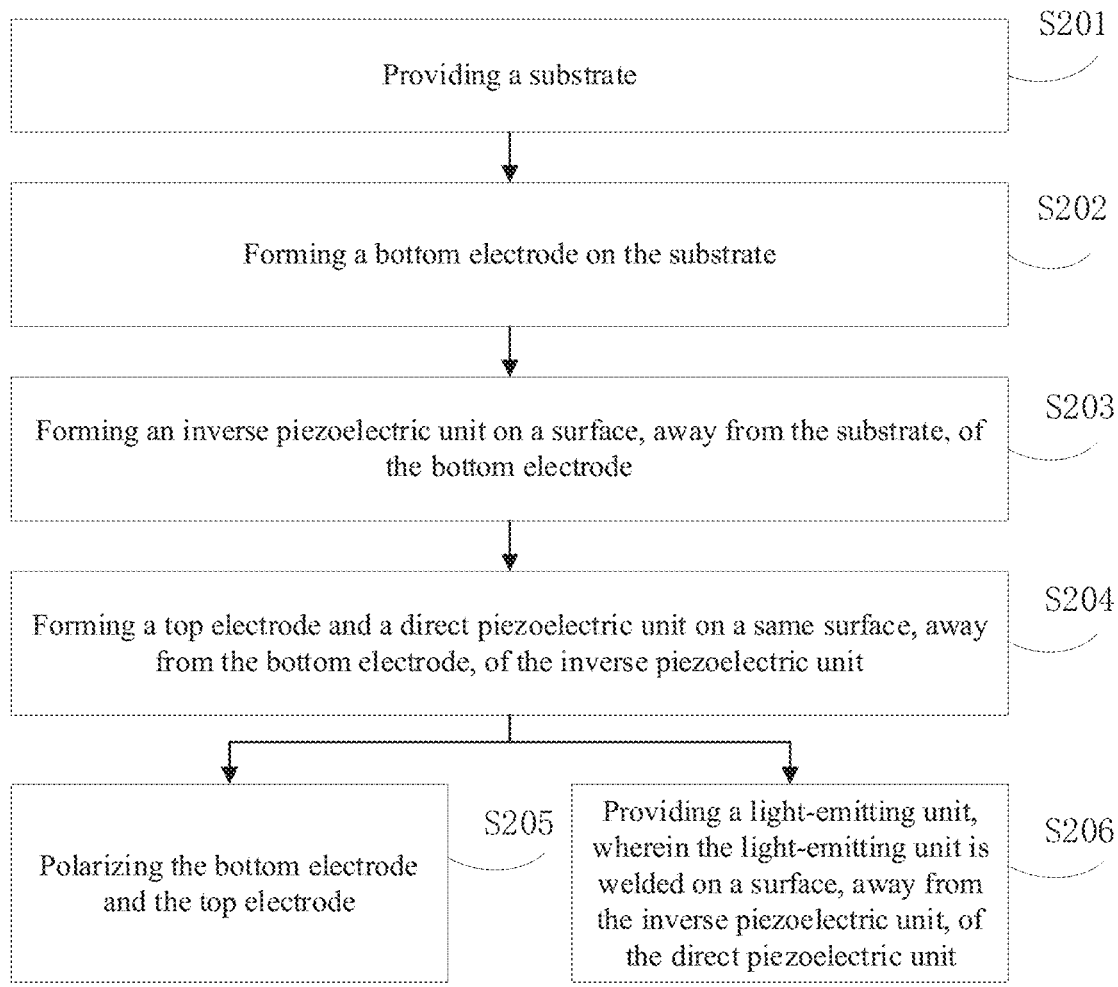
FIG. 5 is a flowchart of a manufacturing method of a vibrator provided by an embodiment of the application.

FIG. 5 shows a flowchart of a manufacturing method of a vibrator provided by an embodiment of the disclosure, and the method comprises:

S201, providing a substrate.

In the embodiment of this disclosure, the substrate may be made of a transparent material, such as a glass substrate and a transparent resin substrate.

S202, forming a bottom electrode on the substrate.

Figure 6:
FIG. 6 is a first structural diagram of a manufacturing method of a vibrator provided by an embodiment of the application.

In the embodiment of this disclosure, referring to FIG. 6, an electrode material may be disposed on the substrate 1 by growth, deposition, imaging and other processes as the bottom electrode 22, and the bottom electrode 22 may be made of a transparent electrode material such as Indium Tin Oxide (ITO), carbon nanotubes, nano silver wires and graphene.

S203, forming an inverse piezoelectric unit on a surface, away from the substrate, of the bottom electrode.

In the embodiment of this disclosure, referring to FIG. 6, a piezoelectric material with the direct piezoelectric effect, such as PZT, may be disposed on a surface, away from the substrate 1, of the bottom electrode 22 by whole surface growth, imaging, deposition and other processes to form the inverse piezoelectric unit 21 as a piezoelectric dielectric layer.

S204, forming a top electrode and a direct piezoelectric unit on a same surface, away from the bottom electrode, of the inverse piezoelectric unit.

Figure 7:
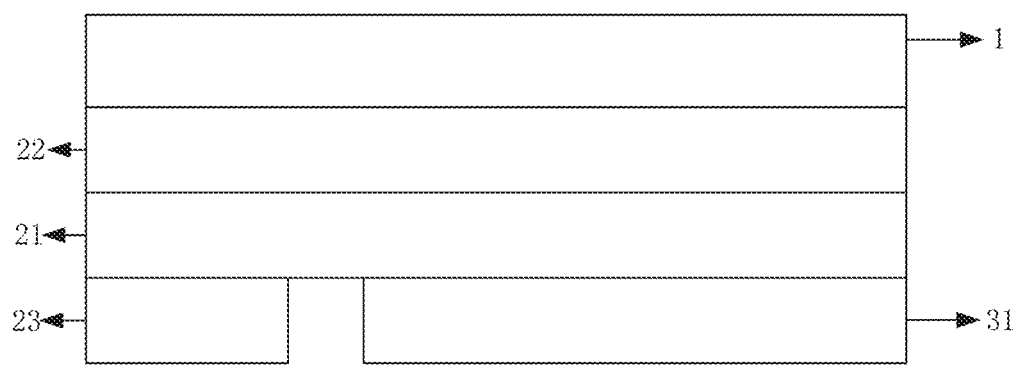
FIG. 7 is a second structural diagram of a manufacturing method of a vibrator provided by an embodiment of the application.

In the embodiment of this disclosure, referring to FIG. 7, a transparent electrode material is also used to make the top electrode 23 on part of a surface, away from the bottom electrode 22, of the inverse piezoelectric unit 21, and the direct piezoelectric unit 31 on another part of a surface, where the top electrode 23 is located, of the inverse piezoelectric unit 21 by growing and deposition. The inverse piezoelectric unit 31 may be provided by a process such as imaging, and the inverse piezoelectric unit 31 may be an interdigital electrode made of a transparent material.

S205, polarizing the bottom electrode and the top electrode.

In the embodiment of this disclosure, the top electrode and the bottom electrode are polarized by applying a preset voltage to the top electrode or the bottom electrode at a preset temperature, and the preset temperature and the preset voltage may be measured by experiments and may be set according to practical requirements, which is not limited here.

S206, providing a light-emitting unit, wherein the light-emitting unit is welded on a surface, away from the inverse piezoelectric unit, of the direct piezoelectric unit.

Figure 8:
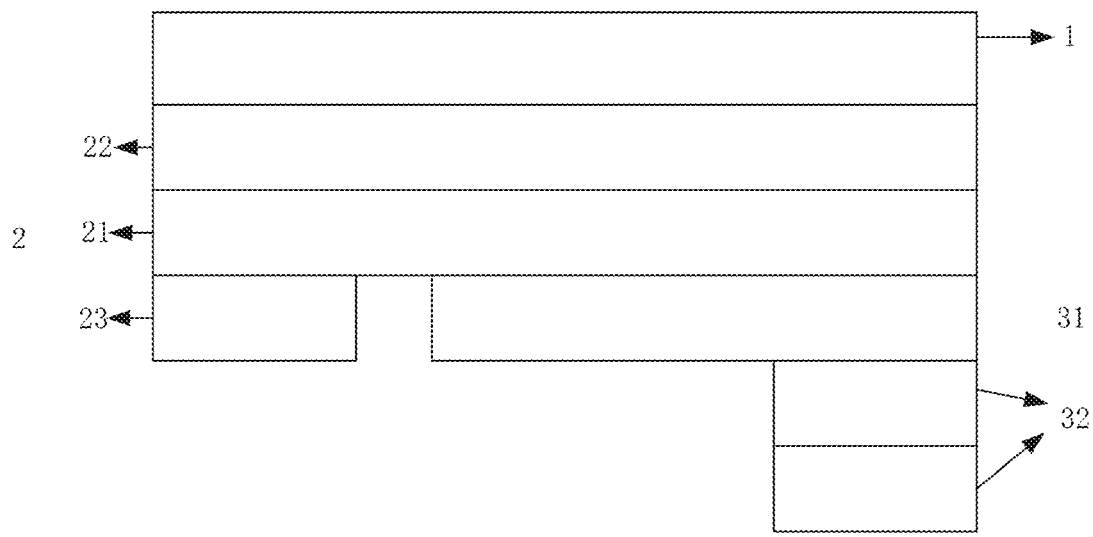
FIG. 8 is a third structural diagram of a manufacturing method of a vibrator provided by an embodiment of the application.

In the embodiment of this disclosure, the light-emitting unit may be an LED unit with a horizontal structure featuring a single layer or a laminated layer, which is not limited here. Referring to FIG. 8, a size of the light-emitting unit 32 only needs to conform to a pad size of the direct piezoelectric unit 31, and soldering materials such as soldering tin or indium may be grown on a pad section of the direct piezoelectric unit 31 to weld the light-emitting unit 32 with the direct piezoelectric unit 31, thereby implementing the electrical connection between the direct piezoelectric unit 31 and the light-emitting unit 32.

Optionally. S205 comprises: applying a voltage to the top electrode to polarize the top electrode and the bottom electrode.

In the embodiment of this disclosure, the top electrode and the bottom electrode may be polarized by applying a voltage to the top electrode, which enables the top electrode to be connected with the external circuit later as an input electrode of an electrical signal.

According to the manufacturing method of the vibrator provided by the embodiment of this disclosure, the inverse piezoelectric unit in the vibrator may be driven by the electric signal to deform to generate vibrations, and the direct piezoelectric unit in contact and connection therewith is driven to deform to generate a current to drive the light-emitting unit to emit light. Therefore, the vibrator may be disposed in a touch-control reproduction screen. Because the amplitude varies, the deformation varies. Therefore, the vibration position and amplitude may be embodied by light spots emitted by the vibrator, so that a vibration waveform may be represented by the light-emitting situation of the light-emitting unit in the vibrator, and then the vibration waveform in the touch-control reproduction screen may be detected efficiently and conveniently.

Figure 9:
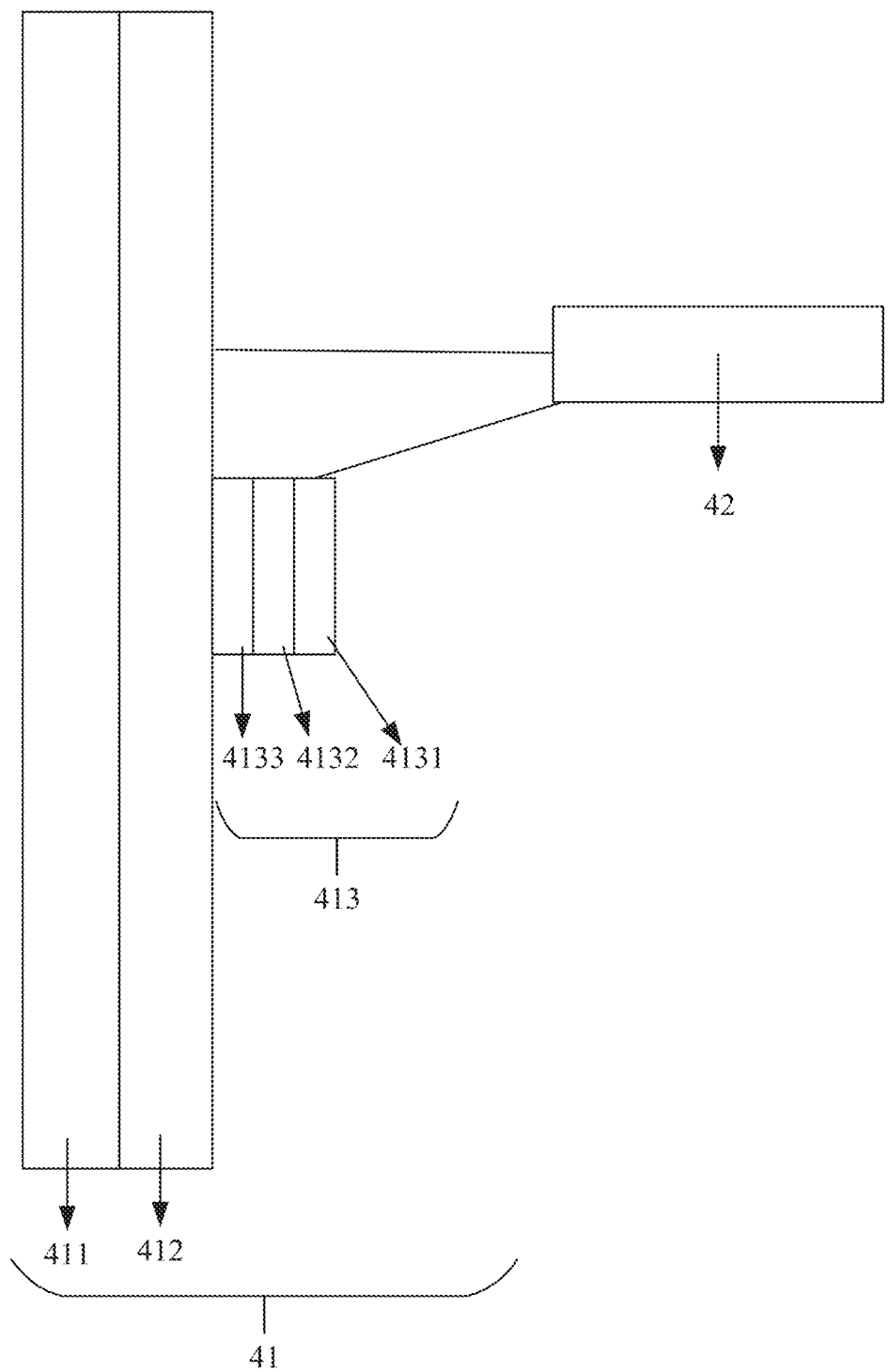
FIG. 9 is a structural diagram of a haptical sensation reproduction apparatus provided by an embodiment of the application.

FIG. 9 shows a structural diagram of a haptical sensation reproduction apparatus provided by an embodiment of the disclosure, comprising a touch display device 41 and a controller 42, wherein the touch display device 41 comprises a display component 411, a touch component 412 and the vibrator 413 according to any one of claims 1-6, the vibrator 413 and the touch component 412 are located on a light-exiting side of the display component 411, and the vibrator 313 is disposed on a surface, away from the display component 411, of the touch component 412; and The controller 42 is electrically connected with the vibrator 413 and the touch component 412, and is configured to acquire a touch signal generated by the touch component 412, and send an electrical signal to the vibrator 413 according to the touch information, so that the inverse piezoelectric unit 4131 in the vibrator 413 resonates with the touch component 412, and the direct piezoelectric unit 4132 in the vibrator 413 deforms to generate a current to drive the light-emitting unit 4133 in the vibrator 413 to emit light.

In the embodiment of this disclosure, the display component 411 is a functional component with an image display function, and the touch component 412 is a sensor with a pressure or friction sensing function, which may generate touch information when receiving a pressure or friction and transmit the touch information to the controller 42. One may refer to the vibrator described above for the vibrator 413, which may not be described in detail here. When a user touches the touch component, the controller 42 will send an electrical signal to the direct piezoelectric unit 4131 in the vibrator 413 according to the touch information acquired from the touch module 412, so that the direct piezoelectric unit 4131 vibrates and drives the inverse piezoelectric unit 4132 to vibrate and deform, and then convert mechanical energy into a current, which is transmitted to the light-emitting unit 4133 in the vibrator 413 for light emission.

Figure 10:
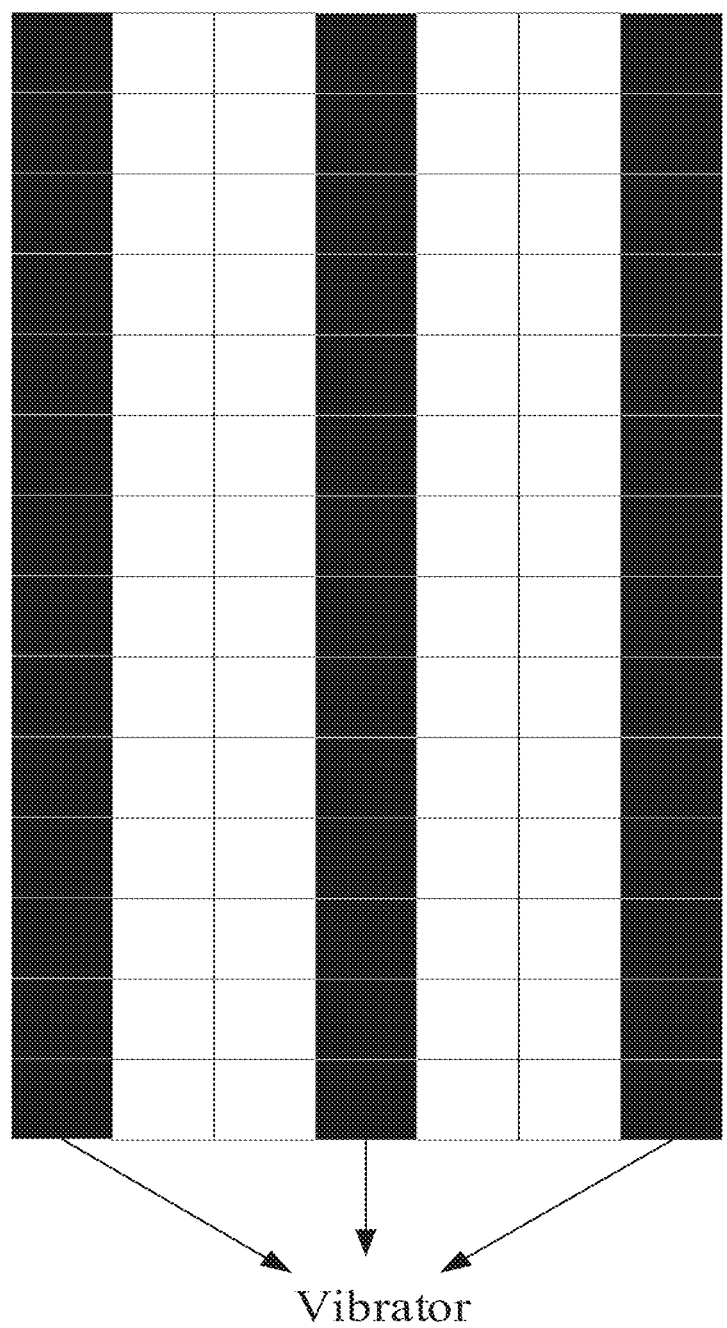
FIG. 10 is a diagram of the arrangement of vibrators provided by an embodiment of the application.

Optionally, referring to FIG. 10, a plurality of the vibrators 413 are disposed in a vertical array on the touch component.

Figures 11, 12:
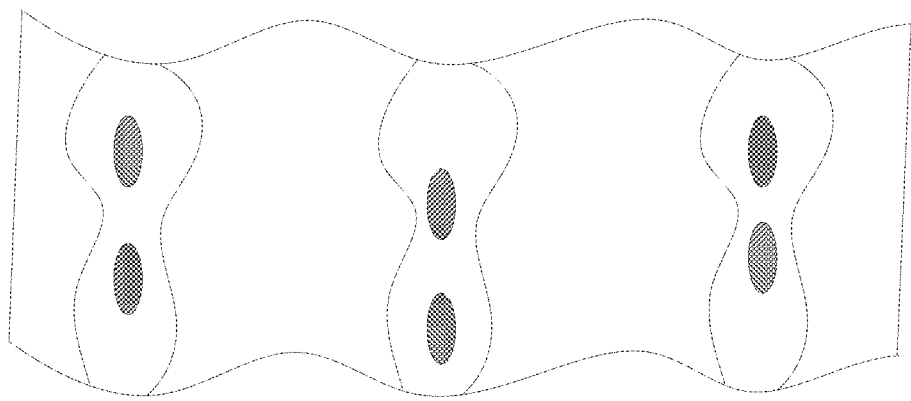
FIG. 11 is an effect diagram of a haptical sensation reproduction apparatus provided by an embodiment of the application.
FIG. 12 is a flowchart of a vibration waveform detection method of a haptical sensation reproduction apparatus provided by an embodiment of the disclosure.

In the embodiment of this disclosure, the plurality of vibrators 413 are disposed in a vertical array on a side, away from the display component, of the touch component, so that light spots emitted by the vibrators may form a vibration waveform as shown in FIG. 11, for example, so that the touch reproduction vibration waveform may be reflected efficiently and visually.

In the embodiment of this disclosure, by arranging the vibrator on the touch component of the haptical sensation reproduction apparatus, the inverse piezoelectric unit in the vibrator may be driven by the electric signal to deform to generate vibrations, and the direct piezoelectric unit in contact and connection therewith is driven to deform to generate a current to drive the light-emitting unit to emit light. Therefore, the vibrator may be disposed in a touch-control reproduction screen. Because the amplitude varies, the deformation varies. Therefore, the vibration position and amplitude may be embodied by light spots emitted by the vibrator, so that a vibration waveform may be represented by the light-emitting situation of the light-emitting unit in the vibrator, and then the vibration waveform in the touch-control reproduction screen may be detected efficiently and conveniently.

FIG. 12 shows a flowchart of a vibration waveform detection method of a haptical sensation reproduction apparatus provided by an embodiment of the disclosure, the haptical sensation reproduction apparatus may be any haptical sensation reproduction apparatus described above, and the method comprises:

S401, acquiring an apparatus image on a light-exiting side of the haptical sensation reproduction apparatus.

In the embodiment of this disclosure, the apparatus image may be obtained by taking a photo of the light-exiting side of the haptical sensation reproduction apparatus with image acquisition equipment.

S402, acquiring a vibration waveform according to a light-emitting image of a vibrator of the haptical sensation reproduction apparatus in the apparatus image.

In the embodiment of this disclosure, because the vibrator in the haptical sensation reproduction apparatus generates a current through the direct piezoelectric effect to drive the light-emitting unit in the vibrator to emit light while generating vibrations through the inverse piezoelectric effect, the apparatus image contains light-emitting images of the vibrator, and the brightness and position of these light-emitting images will change with the change of amplitude, so the vibration waveform of the vibrator in the haptical sensation reproduction apparatus may be characterized by the light-emitting images, that is, the vibration waveform of the haptical sensation reproduction apparatus may be obtained by analyzing the light-emitting images.

In the embodiment of this disclosure, by disposing the vibrator on the touch component of the haptical sensation reproduction apparatus, the inverse piezoelectric unit in the vibrator may be driven by the electric signal to deform to generate vibrations, and the direct piezoelectric unit in contact and connection therewith is driven to deform to generate a current to drive the light-emitting unit to emit light. Therefore, the vibrator may be disposed in a touch-control reproduction screen. Because the amplitude varies, the deformation varies. Therefore, the vibration position and amplitude may be embodied by light spots emitted by the vibrator, so that a vibration waveform may be represented by the light-emitting situation of the light-emitting unit in the vibrator, and then the vibration waveform in the touch-control reproduction screen may be detected efficiently and conveniently.

All the embodiments in this specification are described in a progressive way, and each embodiment focuses on the differences from other embodiments. The same and similar parts among the embodiments are referable to one another.

Although the preferred embodiments the disclosure have been described, those skilled in the art may make additional changes and modifications to these embodiments once they know the basic inventive concepts. Therefore, the appended claims are intended to be interpreted as including preferred embodiments and all changes and modifications falling within the scope of embodiments of the disclosure.

It should be also noted that herein, relational terms such as "first" and "second" are only used to distinguish one entity or operation from another entity or operation, and do not necessarily require or imply any such actual relationship or order between these entities or operations. The terms "comprise", "include" or any other variations thereof, are intended to cover a non-exclusive inclusion, such that a process, method, article, or terminal equipment which includes a list of elements does not include only those elements but also other elements not expressly listed or inherent to such process, method, article, or terminal equipment. Without further limitation, an element defined by the statement "includes a . . . " does not exclude the presence of another identical element in a process, method, article or terminal equipment that includes the element.

The vibrator, the manufacturing method thereof, the haptical sensation reproduction apparatus and the vibration waveform detection method provided by the disclosure are described in detail above. Specific examples are applied herein to illustrate the principle and implementation of the disclosure. The above embodiments are only used to help understand the method of the disclosure and its core ideas. For those of ordinary skill in the art, according to the idea of the disclosure, there will be some changes in the specific implementation and disclosure scope. To sum up, the contents of this specification should not be understood as a limitation of the disclosure.

The invention claimed is:

1. A vibrator, comprising:
   a substrate; and
   a piezoelectric component and a light-emitting component located on the substrate;
   wherein the piezoelectric component comprises an inverse piezoelectric unit;
   the light-emitting component comprises a direct piezoelectric dielectric layer and a light-emitting unit;
   the inverse piezoelectric unit is in contact and connected to the direct piezoelectric dielectric layer, and the direct piezoelectric dielectric layer is electrically connected with the light-emitting unit;
   the piezoelectric component is configured to receive an electrical signal to make the inverse piezoelectric unit deform, to drive the direct piezoelectric dielectric layer to deform; and
   the direct piezoelectric dielectric layer is configured to generate a current when deformation occurs, to drive the light-emitting unit to emit light;
   wherein the piezoelectric component further comprises a top electrode and a bottom electrode;
   the bottom electrode, the inverse piezoelectric unit and the top electrode are disposed in layer configuration on the substrate;
   the bottom electrode is disposed between the inverse piezoelectric unit and the substrate;
   a surface, away from the bottom electrode, of the inverse piezoelectric unit is provided with the top electrode and the direct piezoelectric dielectric layer on a same layer; and
   a surface, away from the inverse piezoelectric unit, of the direct piezoelectric dielectric layer is electrically connected with the light-emitting unit.

2. The vibrator according to claim 1, wherein an external circuit is disposed on the top electrode, and the top electrode is configured to receive an electrical signal sent by the external circuit, to make the inverse piezoelectric unit deform.

3. The vibrator according to claim 1, wherein the light-emitting unit comprises an LED electrode and an LED chip, the LED electrode is electrically connected with the direct piezoelectric dielectric layer, and the LED electrode is disposed between the direct piezoelectric dielectric layer and the LED chip.

4. The vibrator according to claim 1, wherein the inverse piezoelectric unit is a piezoelectric ceramic electrode, and the direct piezoelectric dielectric layer is an interdigital electrode.

5. The vibrator according to claim 1, wherein the substrate is a transparent substrate.

6. A manufacturing method of the vibrator according to claim 1, comprising:
   providing a substrate;
   forming a bottom electrode on the substrate;
   forming an inverse piezoelectric unit on a surface, away from the substrate, of the bottom electrode;
   forming a top electrode and a direct piezoelectric dielectric layer on a same surface, away from the bottom electrode, of the inverse piezoelectric unit;

polarizing the bottom electrode and the top electrode; and providing a light-emitting unit, wherein the light-emitting unit is welded on a surface, away from the inverse piezoelectric unit, of the direct piezoelectric dielectric layer.

7. The method according to claim 6, wherein polarizing the bottom electrode and the top electrode comprises:

applying a voltage to the top electrode, to polarize the top electrode and the bottom electrode.

8. A haptical sensation reproduction apparatus, comprising:

a touch display device; and a controller;

wherein the touch display device comprises a display component, a touch component and the vibrator according to claim 1, the vibrator and the touch component are located on a light-exiting side of the display component, and the vibrator is disposed on a surface, away from the display component, of the touch component; and the controller is electrically connected with the vibrator and the touch component, and is configured to acquire a touch signal generated by the touch component, and send an electrical signal to the vibrator according to touch information, so that the inverse piezoelectric unit in the vibrator resonates with the touch component, and the direct piezoelectric dielectric layer in the vibrator deforms to generate a current to drive the light-emitting unit in the vibrator to emit light.

9. The haptical sensation reproduction apparatus according to claim 8, wherein a plurality of the vibrators are disposed in a vertical array on the touch component.

10. The haptical sensation reproduction apparatus according to claim 8, wherein the light-emitting unit comprises an LED electrode and an LED chip, the LED electrode is electrically connected with the direct piezoelectric dielectric layer, and the LED electrode is disposed between the direct piezoelectric dielectric layer and the LED chip.

11. The haptical sensation reproduction apparatus according to claim 8, wherein the inverse piezoelectric unit is a piezoelectric ceramic electrode, and the direct piezoelectric dielectric layer is an interdigital electrode.

12. The haptical sensation reproduction apparatus according to claim 8, wherein the substrate is a transparent substrate.

13. The haptical sensation reproduction apparatus according to claim 8, wherein an external circuit is disposed on the top electrode, and the top electrode is configured to receive an electrical signal sent by the external circuit, to make the inverse piezoelectric unit deform.

14. A vibration waveform detection method of the haptical sensation reproduction apparatus claim 8, comprising:

acquiring an apparatus image on a light-exiting side of the haptical sensation reproduction apparatus; and acquiring a vibration waveform according to a light-emitting image of a vibrator of the haptical sensation reproduction apparatus in the apparatus image.

15. The vibration waveform detection method of the haptical sensation reproduction apparatus according to claim 14, further comprising:

wherein a plurality of the vibrators are disposed in a vertical array on the touch component.

* * * * *